United States Patent
Black et al.

(10) Patent No.: US 6,773,982 B2
(45) Date of Patent: Aug. 10, 2004

(54) FERAM CELL WITH INTERNAL OXYGEN SOURCE AND METHOD OF OXYGEN RELEASE

(75) Inventors: Charles Thomas Black, White Plains, NY (US); Cyril Cabral, Jr., Ossining, NY (US); Alfred Grill, White Plains, NY (US); Deborah Ann Neumayer, Danbury, CT (US); Wilbur David Pricer, Charlotte, VT (US); Katherine Lynn Saenger, Ossining, NY (US); Thomas McCarroll Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 09/927,694

(22) Filed: Aug. 10, 2001

(65) Prior Publication Data

US 2002/0074581 A1 Jun. 20, 2002

Related U.S. Application Data

(62) Division of application No. 09/325,857, filed on Jun. 4, 1999.

(51) Int. Cl.[7] .......................................... H01L 21/8242
(52) U.S. Cl. ...................... 438/240; 238/210; 238/239; 238/241; 238/3
(58) Field of Search ................................ 438/199, 201, 438/211, 238, 216, 210, 239, 240, 241, 250, 253, 256, 257, 393, 396, 3

(56) References Cited

U.S. PATENT DOCUMENTS

| | | | |
|---|---|---|---|
| 5,466,629 A | * 11/1995 | Mihara et al. | ................. 438/3 |
| 5,624,864 A | 4/1997 | Arita et al. | |
| 5,658,820 A | 8/1997 | Chung | |
| 5,702,970 A | 12/1997 | Choi | |
| 5,716,875 A | 2/1998 | Jones, Jr. et al. | |
| 5,736,422 A | 4/1998 | Lee et al. | |
| 5,784,310 A | 7/1998 | Cuchiaro et al. | |
| 5,812,442 A | 9/1998 | Yoo | |
| 5,821,005 A | 10/1998 | Kijima et al. | |
| 5,822,239 A | 10/1998 | Ishihara et al. | |
| 5,932,907 A | * 8/1999 | Grill et al. | ................. 257/310 |
| 5,973,911 A | * 10/1999 | Nishioka | ................. 361/313 |
| 6,015,989 A | * 1/2000 | Horikawa et al. | ................. 257/309 |
| 6,165,802 A | * 12/2000 | Cuchiaro et al. | ................. 438/3 |
| 6,316,801 B1 | * 11/2001 | Amanuma | ................. 257/306 |
| 6,322,849 B2 | * 11/2001 | Joshi et al. | ................. 427/96 |
| 6,462,931 B1 | * 10/2002 | Tang et al. | ................. 361/305 |

FOREIGN PATENT DOCUMENTS

EP      0 883 167 A2      12/1998

OTHER PUBLICATIONS

Jung et al. "A Highly Reliable 1T/1C Ferroelectric Memory", 1998, IEEE, pp. 122–123.*

(List continued on next page.)

*Primary Examiner*—Maria Guerrero
(74) *Attorney, Agent, or Firm*—Scully, Scott, Murphy & Presser; William D. Sabo, Esq.

(57) ABSTRACT

An integrated ferroelectric/CMOS structure which comprises at least a ferroelectric material, a pair of electrodes in contact with opposite surfaces of the ferroelectric material, where the electrodes do not decompose at deposition or annealing, and an oxygen source layer in contact with at least one of said electrodes, said oxygen source layer being a metal oxide which at least partially decomposes during deposition and/or subsequent processing is provided as well as a method of fabricating the same.

17 Claims, 4 Drawing Sheets

OTHER PUBLICATIONS

Robert E. Jones, Jr. "Ferroelectric Nonvolatile Memories for Embedded Applications", 1998, IEEE, pp. 431–438.*

J. R. McBride, et al., "Growth and Characterization of Relatively Sputtered Thin–Film Platinum Oxides," J. Appl. Phys., vol. 69, No. 3, pp. 1596–1604 (1991).

J.–H. Joo, et al., "Improvement of Leakage Currents of Pt/(Ba, Sr) TiO3/Pt Capacitors," Appl. Phys. Lett., vol. 70, No. 22, pp. 3053–3055 (1997).

Y. Abe, et al., "Preparation of Oxygen–Containing Pt and Pt Oxide Thin Films by Reactive Sputtering and Their Characterization," Jpn. J. Appl. Phys., vol. 37, No. 8, pp. 4482–4480 (1998).

Y. Tsunemine, et al., "A Manufacturable Integration Technology of Sputter–BST Capacitor With a Newly Proposed Thick Pt Electrode," Paper 30–3, IEDM (Dec. 1998).

* cited by examiner

FERAM CELL WITH INTERNAL OXYGEN SOURCE AND METHOD OF OXYGEN RELEASE

This application is a divisional of U.S. application Ser. No. 09/325,857 filed on Jun. 4, 1999.

FIELD OF THE INVENTION

The present invention relates to ferroelectric (FE) capacitors and to a method of fabricating the same. More specifically, the present invention relates to an integrated ferroelectric capacitor/CMOS structure which comprises at least a ferroelectric material, a pair of electrodes in contact with opposite surfaces of the ferroelectric material, wherein the electrodes do not decompose at deposition or subsequent processing, and an oxygen source layer in contact with at least one of said electrodes, said oxygen source layer comprising a metal oxide which at least partially decomposes during deposition and/or subsequent processing.

BACKGROUND OF THE PRIOR ART

Recent advances in ferroelectric (FE) materials have led to renewed interest in their use for memory device applications. One of the primary advantages of ferroelectric materials is that they can provide non-volatile memory. Another advantage is that ferroelectric materials have a very high dielectric constant (on the order of 20 or above) associated therewith. The number of applications requiring inexpensive non-volatile memory is rapidly expanding. A breakthrough which would enable cheap integration of non-volatile memory would accelerate this trend.

Ferroelectric materials pose several integration challenges which have not yet been solved. In particular, ferroelectric materials typically require oxygen annealing after deposition of the material in order to operate as a storage medium. This annealing step is preferably carried out after the top electrode of the capacitor and before the BEOL (back end of the line) films are in place. The annealing not only serves to improve the quality of the electrode/ferroelectric interface, but it also repairs damage to the ferroelectric material that may arise from any high energy processing steps, such as an anistropic etching for top electrode and/or ferroelectric patterning. Acceptable device characteristics may further require additional oxygen annealing after BEOL processing, to remove oxygen vacancies created in the ferroelectric material during exposure to hydrogen in steps such as dielectric deposition and forming gas anneals.

The inability of oxygen to permeate the numerous BEOL films limits the effectiveness of anneals towards the end of the wafer fabrication process. In addition, oxygen anneals are typically incompatible with BEOL materials such as Cu, which is easily oxidized, and organic low-k dielectrics, which react with oxygen to form volatiles. These factors present a problem since anneals greatly improve the storage characteristics of the ferroelectric material.

There is thus a great need for developing a method which can be employed in fabricating an integrated ferroelectric/CMOS structure which has improved storage characteristics. Such a method should obviate or mitigate the need for high temperature oxygen anneals at late stages in processing when the BEOL layers are in place. Any method developed should achieve this goal despite difficulties in getting oxygen to permeate through the various BEOL film layers without oxidation damage to any of the BEOL layers.

SUMMARY OF THE INVENTION

One object of the present invention is to provide an integrated ferroelectric/CMOS structure which has improved storage characteristics.

Another object of the present invention is to provide an integrated ferroelectric/CMOS structure wherein sufficient oxygen is present in the integrated structure to obviate or mitigate the need for high temperature oxygen anneals at late stages in processing.

A further object of the present invention is to provide a method of manufacturing an integrated ferroelectric/CMOS structure wherein sufficient oxygen is present therein such that the storage characteristics of the integrated structure is improved upon at least partial release of said oxygen.

A still further object of the present invention is to provide a simple method of fabricating an integrated ferroelectric/CMOS structure which can be used with CMOS technology as well as BEOL technology.

These and other objects and advantages can be obtained in the present invention for both ferroelectric capacitors and non-ferroelectric capacitors containing high-epsilon ($\epsilon \geq 20$) dielectric materials by utilizing an oxygen source layer in the integrated structure. This oxygen source layer is typically a metal oxide which will at least partially decompose during ferroelectric/high-epsilon material deposition and/or subsequent device processing to release oxygen into the integrated structure, with consequent improvement of device storage characteristics. The decomposition and/or oxygen release temperature, Td, of the oxygen source layer is preferably low enough to allow substantial oxygen release without damage to the layers in the integrated structure (i.e., Td preferably $\leq 700°$ C.), yet high enough to insure that complete oxygen release does not occur during BEOL fabrication (i.e., Td preferably $\geq 350–400°$ C.). The aforementioned subsequent device processing may additionally include a post-BEOL anneal specifically directed toward releasing the desired amount of oxygen from the oxygen source layer.

In one aspect of the present invention, a ferroelectric capacitor is provided which comprises:

a conductive electrode layer;

a ferroelectric layer disposed on said conductive electrode layer;

a conductive counterelectrode layer formed on said ferroelectric layer; and an at least partially decomposed oxygen source layer proximate to one of said conductive electrode layers.

The above ferroelectric capacitor may also comprise one or more additional conductive electrode layers. These additional electrode layers can be positioned either above or below the conductive electrode layers of the inventive capacitor. One or more oxygen-impermeable dielectric overlayers can be formed above the uppermost layer of the storage capacitor of the present invention. The conductive electrodes of the ferroelectric capacitor of the present invention may be independently patterned or unpatterned.

The ferroelectric capacitor described above forms part of the integrated ferroelectric/CMOS structure of the present invention. Specifically, the integrated FE/CMOS structure of the present invention comprises:

a CMOS structure having at least one transistor region;

a ferroelectric capacitor formed on said CMOS structure, said ferroelectric capacitor comprising a conductive electrode layer, a ferroelectric layer disposed on said conductive electrode layer, a conductive counterelectrode layer formed on said ferroelectric layer, and an at least partially decomposed oxygen source layer proximate to one of said conductive electrode layers; and wiring levels formed on said ferroelectric capacitor.

In another aspect of the present invention, a method is provided for fabricating an integrated ferroelectric capacitor/CMOS structure. In accordance with this aspect of the present invention, the method comprises the steps of:

(a) forming at least one complementary metal oxide semiconductor (CMOS) device on a semiconductor wafer;

(b) forming a ferroelectric capacitor over said CMOS device, said ferroelectric capacitor comprising at least one oxygen source layer in proximity to a conductive electrode layer, said oxygen source layer being capable of at least partially decomposing at temperatures below 700° C.;

(c) forming wiring levels on said ferroelectric capacitor at temperatures below 450° C.; and (d) optionally annealing the structure at a temperature above 300° C. so as to at least partially decompose the oxygen source layer releasing oxygen in the ferroelectric capacitor.

While the above aspects of the invention have been described for ferroelectric capacitors only, it should be understood that the scope of the present invention includes the application of the same inventive aspects and elements to non-ferroelectric capacitors containing high-epsilon dielectric materials.

DETAILED DESCRIPTION OF THE INVENTION

Figure 1A:
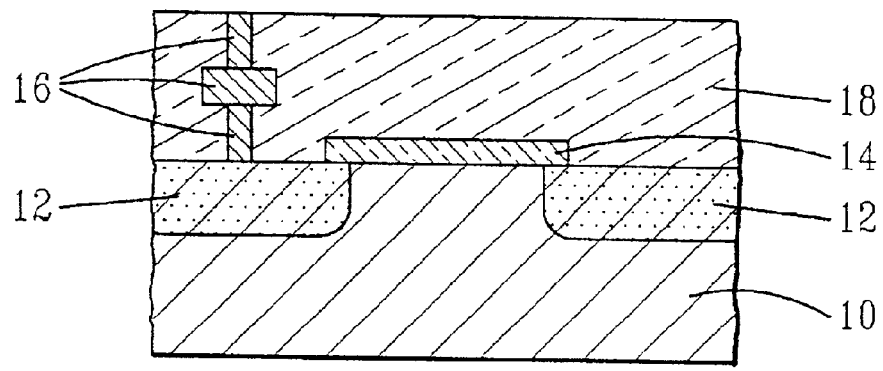
FIGS. 1(a)–(c) show the various processing steps that are employed in one embodiment of the present invention for fabricating an integrated FE capacitor/CMOS structure.

The present invention will now be described in greater detail by referring to the drawings that accompany the present application. It should be noted that in the accompanying drawings like reference numerals are used for describing like and corresponding elements of the drawings.

Figure 1B:
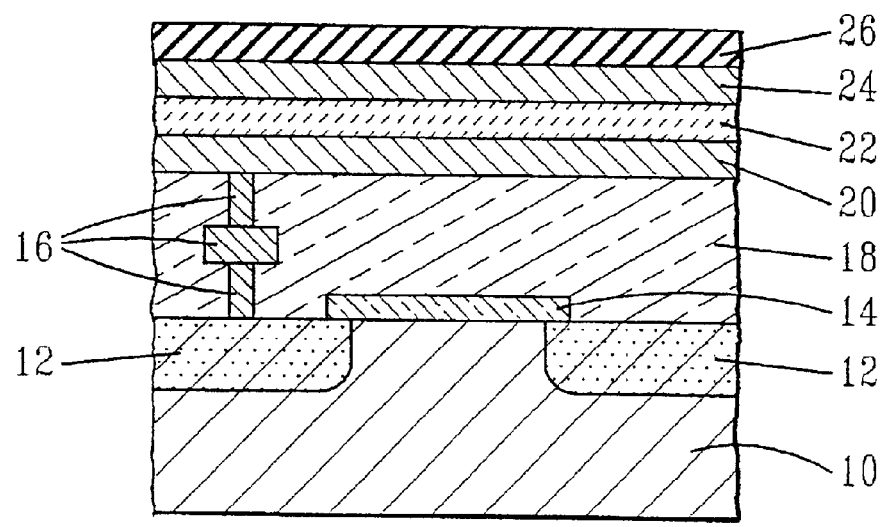
Figure 1C:
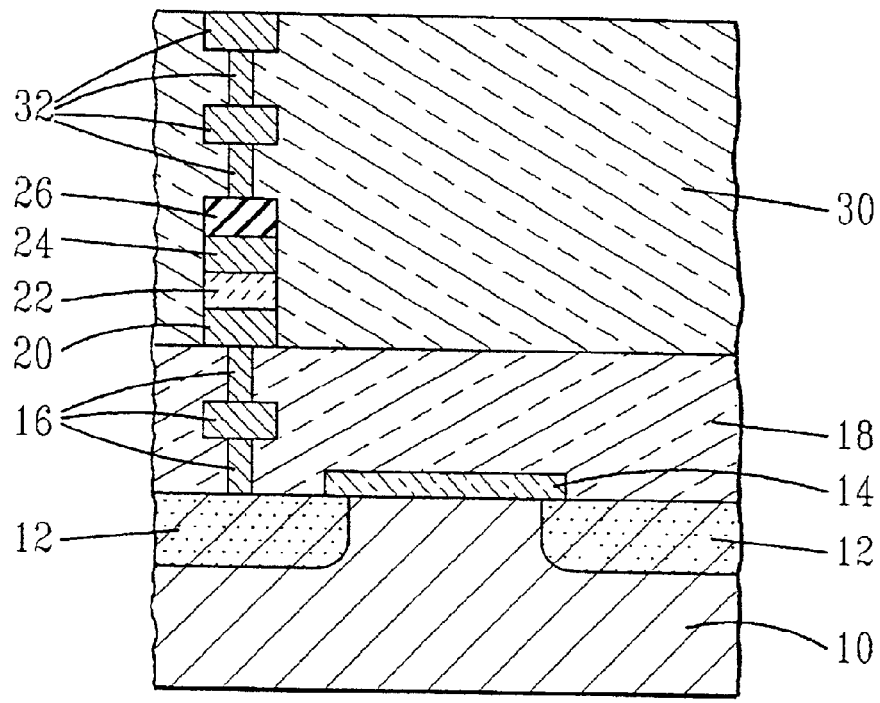

Reference is made to FIGS. 1(a)–(c) which illustrate one embodiment of the method of the present invention. In this embodiment, the oxygen source layer is shown on top of the conductive counterelectrode layer. Although illustration is given for this specific embodiment, the method of the present invention also contemplates variations in the same which will be described hereinbelow.

FIG. 1(a) illustrates the initial structure of the present invention which includes a portion of a CMOS structure which may contain additional elements besides those illustrated that are well known to those skilled in the art. Specifically, the structure shown in FIG. 1(a) comprises a semiconductor substrate 10 having diffusion regions 12, i.e. diffused portions of the bitlines formed in the surface thereof. On top of the semiconductor substrate there is shown a transistor region 14 which is in contact with the diffusion regions. The structure shown in FIG. 1(a) further comprises conductive layers 16 which are formed in a dielectric layer 18.

The structure shown in FIG. 1(a) is composed of conventional materials that are well known to those skilled in the art and it is fabricated using techniques that are also well known in the art. For example, semiconductor substrate 10 is composed of any semiconducting material including, but not limited to: Si, Ge, SiGe, GaAs, InAs, InP, all other III/V semiconducting compounds and organic semiconductors. The semiconductor substrate may be doped or undoped. The diffusion regions may contain p or n type dopants.

Transistor region 14 is comprised of a conventional gate stack which includes a layer of gate insulator such as $SiO_2$ formed on the surface of the semiconductor substrate and a layer of polysilicon or other gate conductor formed on the gate insulator. A salicide layer may be formed on top of the polysilicon or gate conductor. Transistor region 14 may also include sidewall isolation regions as well as other conventional components well known to those skilled in the art. For simplicity, the various elements of the transistor are not shown in the drawings, but are nevertheless intended to be included in transistor region 14.

Conductive layers 16 comprise conductive materials known to the art such as metals, conductive nitrides, conductive metal silicon nitrides, conductive silicides, conductive oxides and mixtures or multilayers thereof. Exemplary conductive materials include: Cu, W, Al, polysilicon, TiN, Ta, TaN, Ti and $WSi_x$. Conductive layers 16 may comprise a number of metal lines and vias which can be composed of the same or different conductive material. For simplicity, the drawings of the present invention show two vias and one metal line.

Dielectric layer 18 is composed of any inorganic or organic dielectric material known in the art including, but not limited to: $SiO_2$, $Si_3N_4$, SiCOH, diamond, diamond-like carbon (i.e. amorphous C), paralyene polymers, polyimides, silicon-containing polymers and other suitable dielectric materials. Dielectric layer 18 may be composed of the same material, as is depicted in FIG. 1(a), or different dielectric materials can be employed. When different dielectric materials are used, a barrier layer, not shown in the drawings, may be formed between each successive dielectric layer. The optional barrier layer is composed of conventional materials including, but not limited to: $SiO_2$, $Al_2O_3$, $TiO_2$, $Si_3N_4$, $SiO_xN_y$, and $Ta_2O_5$.

As stated above, the structure shown in FIG. 1(a) is fabricated using conventional processing steps which are well known to those skilled in the art including: semiconductor device fabrication and back end of the line (BEOL) processing. For example, the CMOS device shown in FIG. 1(a) can be fabricated by forming the transistor region on the surface of the semiconductor substrate, i.e. growing a gate insulator, depositing a gate conductor on said gate insulator and thereafter patterning those layers to provide the transistor region. The diffusion regions can then be formed using conventional ion implantation and annealing.

Conductive layers 16 of the CMOS structure shown in FIG. 1(a) are then typically formed by: depositing a first dielectric layer on the surface of the semiconductor structure, opening a via in the dielectric layer, filling the via with a conductive material, planarizing the structure using conventional planarization techniques such as chemical-mechanical polishing or grinding, and then forming a metal line by depositing a second dielectric layer, opening a trench in the second dielectric layer, filling the trench with a conductive material and planarization.

In accordance with the present invention, a ferroelectric capacitor is the formed on the CMOS structure shown in FIG. 1(a). This step of the present invention is shown in FIG. 1(b). The ferroelectric capacitor may be patterned, non-patterned or contain a mixture of patterned and non-patterned layers.

Specifically, a conductive electrode layer 20 is first formed on the surface of the CMOS structure so that it is in electrical contact with the conductive layers of the CMOS structure. The conductive electrode layer 20 is the bottom electrode of the ferroelectric capacitor of the present invention.

Suitable conductive electrode materials that can be used in the present invention as conductive electrode layer 20 include, but are not limited to: noble metals such as Pt, Pd, Ir, Rh, Os, Au, Ag, and Ru; noble metal oxides such as $PtO_x$, $IrO_x$, $PdO_x$, $RhO_x$, $OsO_x$, $AuO_x$, $AgO_x$ and $RuO_x$; conductive oxides such as $SrRuO_3$, $LaSrCoO_3$ and $YBa_2Cu_3O_7$; mixtures and multilayers thereof. The noble metals and/or oxides may be crystalline or in an amorphous form. The conductive electrode layer of the capacitor may be unpatterned, or patterned using conventional lithography and RIE. Electrode layer 20 may further include one or more layers of conductive barrier materials selected from the group containing metal nitrides (for example TiN, TaN, WN, TaAlN, TiAlN) metal silicon nitrides (for example, TaSiN, TiSiN), metal oxides, and metal oxynitrides.

After forming conductive electrode layer 20, which may include planarization, the structure may optionally be subjected to an appropriate surface treatment step. Suitable surface treatments that may optionally be employed in the present invention include: oxidation by plasma ashing, thermal oxidation, surface chemical treatments and application of a thin metal oxide layer by chemical solution deposition (CSD), chemical vapor deposition (CVD) or physical vapor deposition (PVD).

In accordance with the present invention, a ferroelectric layer 22 is formed on the surface of conductive electrode layer 20. While layer 22 is described here and below as ferroelectric, it should be understood that layer 22 may comprise a non-ferroelectric high-epsilon ($\epsilon \geq 20$) dielectric material without deviating from the intents of this invention. Ferroelectric layer 22 may be patterned or unpatterned. When patterned the ferroelectric film may be surrounded by a dielectric layer to ensure a planar structure. A suitable anneal may be performed after forming ferroelectric layer 22 to achieve desired ferroelectric properties. Typically, such an anneal is carried out at a temperature of about 600° C. or above.

The ferroelectric layer or non-ferroelectric high-epsilon layer that is employed in the present invention is a dielectric material which has a dielectric constant of 20 or above. This includes a crystalline, polycrystalline or amorphous high dielectric constant material. Preferred ferroelectric materials employed as layer 22 include, but are not limited to: the perovskite-type oxides, compounds containing pyrochlore structures such as $Cd_2Nb_2O_7$, potassium dihydrogen phosphates, phosphates of rubidium, cesium or arsenic and other like ferroelectric materials. Combinations of these ferroelectric materials or multilayers are also contemplated herein. High-epsilon materials may also be employed in the present invention as the high dielectric constant ferroelectric layer. The high dielectric material may display a spontaneous electric polarization (for NVRAM) or not (for DRAM).

Of the aforementioned ferroelectric materials, it is highly preferred that ferroelectric layer 22 of the present invention be composed of a perovskite-type oxide. The term "perovskite-type oxide" is used herein to denote a material which includes at least one acidic oxide containing at least one metal from Group IVB (Ti, Zr or Hf), VB (V, Nb or Ta), VIB (Cr, Mo or W), VIIB (Mn or Re), IIIA (Al, Ga or In) or IB (Cu, Ag or Au) of the Periodic Table of Elements (CAS version) and at least one additional cation having a positive formal charge of from about 1 to about 3. Such perovskite-type oxides typically have the basic formula: $ABO_3$ wherein A is one of the above mentioned cations, and B is one of the above mentioned metals which forms the acidic oxide.

Suitable perovskite-type oxides include, but are not limited to: titanate-based ferroelectrics, manganate-based materials, cuprate-based materials, tungsten bronze-type niobates, tantalates, or titanates, and bismuth layered-tantalates, niobates or titanates. Of these perovskite-type oxides, it is preferred to use strontium bismuth tantalate, strontium bismuth niobate, bismuth titanate, strontium bismuth tantalate niobate, lead zirconate titanate, lead lanthanum zirconate titanate, and compositions of these materials modified by the incorporation of dopants as the ferroelectric material.

A conductive counterelectrode layer 24 is then formed on the surface of ferroelectric layer 22. The counterelectrode layer which forms the top electrode of the storage capacitor of the present invention may be formed of the same or different conductive material as conductive electrode layer 20. The counterelectrode layer may also be patterned or unpatterned.

The final layer shown in FIG. 1(b) is an oxygen source layer 26 which is capable of at least partially decomposing below 700° C. so as to release sufficient oxygen into the structure to cause improvements in the storage characteristics of the ferroelectric capacitor. Preferably the oxygen source layer comprises a conductive metal oxide having the formula $MO_x$, wherein M is selected from the group consisting of a noble metal such as Pd, Pt, Ir, Rh, Ru and Os, a non-noble metal, and mixtures or alloys of these metals. The oxygen source layer may further be a mixture or multilayer combination of these $MO_x$ oxides alone or with one or more elemental additives selected from the group containing noble metals, non-noble metals, nitrogen (N), semiconductors such as Si, Ge, C, and B. Mixtures may be uniform in composition or graded in composition.

The value of x in $MO_x$ may range from about 0.03 to about 3. $MO_x$ materials having low values of x would typically have M-like structures distorted by interstitial oxygen incorporation; $MO_x$ materials having high values of x would typically have metal-oxide-like lattice structures and M-O bonding. The oxygen source layer may be crystalline or amorphous, or a mixture of crystalline and amorphous phases. Crystalline oxygen source layers may include: PdO, $PtO_2$, PtO, $Pt_3O_4$, and $IrO_2$. Oxygen source layers comprising metal-$MO_x$ mixtures include: $PtO_x$ mixed with Pt.

Noble metal alloy oxides (or mixtures of noble metal oxides) comprising two or more component oxides having different decomposition characteristics are particularly preferred oxygen source layers, since their decomposition characteristics can be tuned by changing the relative proportions of the component oxides. Examples of such oxygen source layers include: $Ir_yPt_zO_x$ or $Pd_yPt_zO_x$, in which a relatively stable noble metal oxide ($IrO_2$ or PdO) having a high decomposition temperature is combined with a relatively unstable noble metal oxide ($PtO_x$) having a low decomposition temperature to provide a material with an intermediate decomposition temperature.

The oxygen source layer may be patterned or unpatterned, and is preferably conductive, to facilitate electrical connection to the top electrode. However, an insulating oxide may be used for oxygen source if contact holes are provided therein.

Figure 2A:
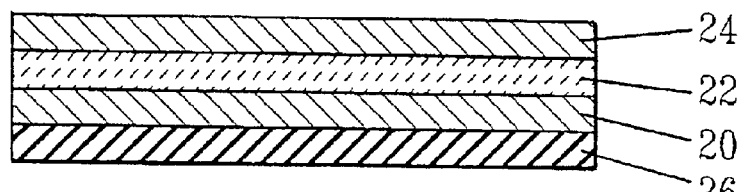
FIGS. 2(a)–(f) shows cross-sectional views of other ferroelectric capacitors of the present invention wherein the oxygen source layer is depicted in different portions of the structure.
Figure 2B:
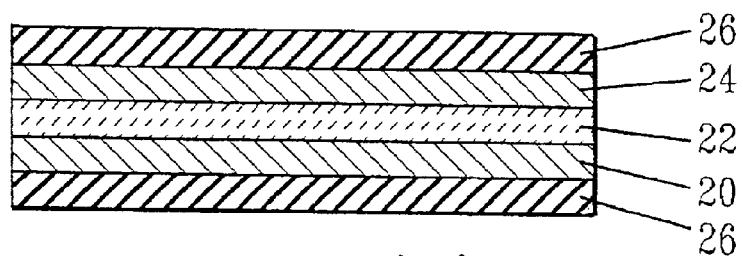
Figure 2C:
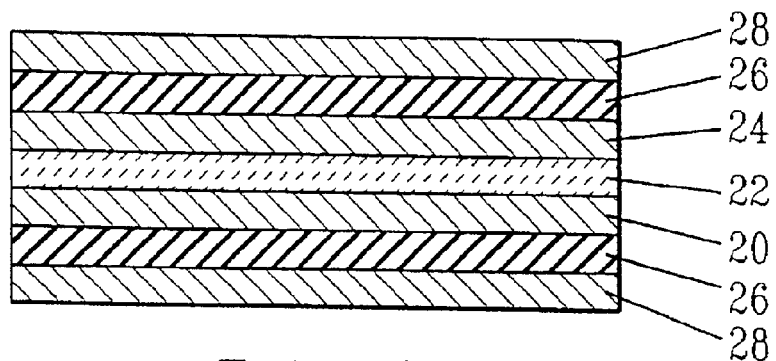
Figure 2D:
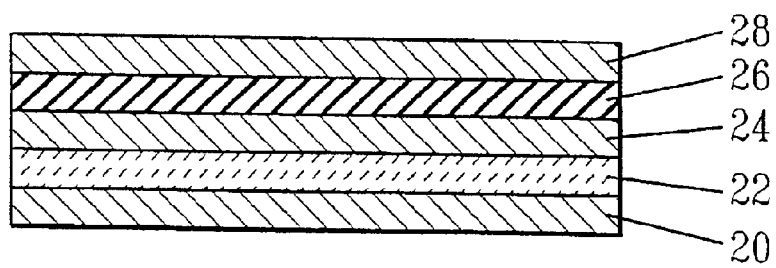
Figure 2E:
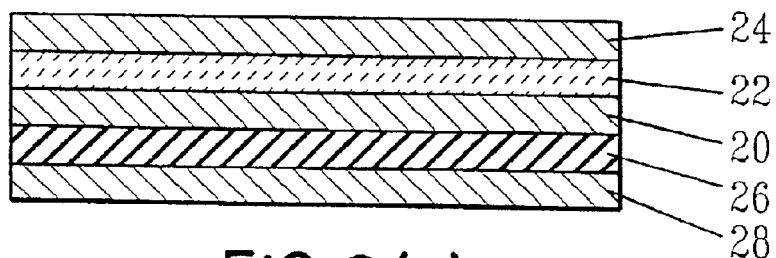
Figure 2:
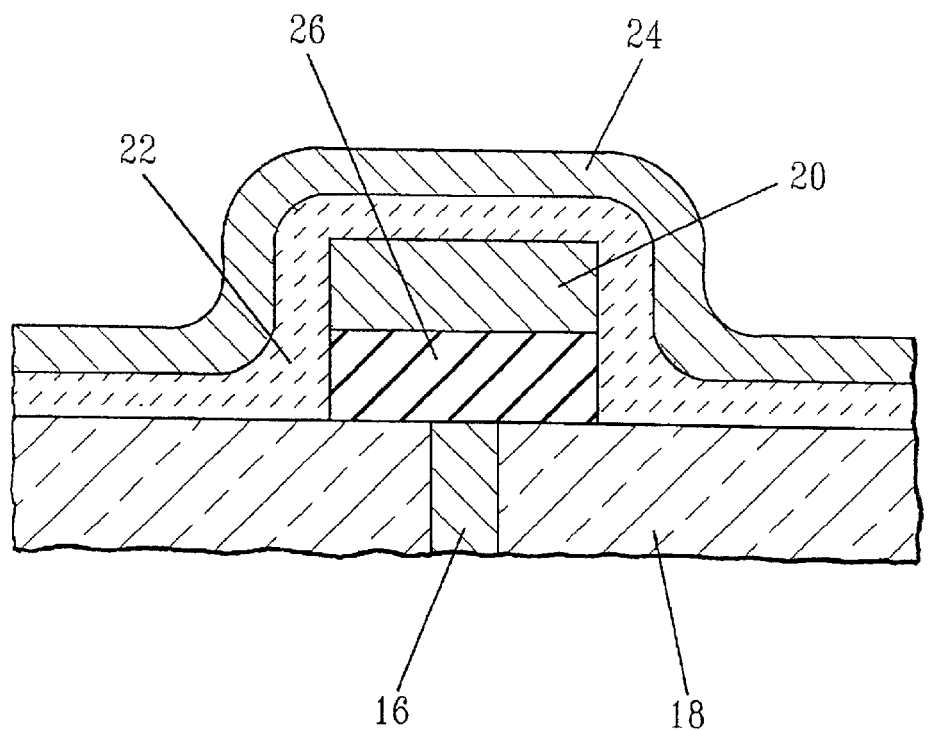

It is noted that in FIG. 1(b), layers 20, 22, 24 and 26 represent one possible configuration of the ferroelectric capacitor of the present invention. Other possible configurations are shown in FIGS. 2(a)–(f). In these figures, reference numerals 20, 22, 24 and 26 are as defined above. Reference numeral 28 represents an optional conductive electrode layer that may be present in the present invention which may comprise any of the electrode and barrier materials listed previously. Common to each of these figures is that the oxygen source material is formed in proximity to one of the electrode layers of the ferroelectric capacitor of the present invention. FIG. 2(f) shows a three dimensional (non-planar) ferroelectric capacitor that can be also be formed using the method of the present invention. Optional sidewall spacers may be present on patterned layers 20 and 26 of the structure shown in FIG. 2(f).

The various layers which make-up the ferroelectric capacitor of the present invention are formed using conventional deposition processes well known to those skilled in the art. For example, layers 20, 24, 26 and optional layer 28 may be formed by chemical vapor deposition (CVD), plasma-assisted CVD, electron beam evaporation, thermal evaporation, thermal oxidation, sputtering, reactive sputtering, plating and other like deposition techniques alone or in combination. After deposition of each layer, the structure may optionally be planarized using conventional techniques such as chemical-mechanical polishing. Patterning may also be performed using conventional lithography and reactive ion etching.

Ferroelectric material layer 22 is also formed using conventional deposition techniques well known to those skilled in the art including, but not limited to: chemical solution deposition (CSD), sol gel, metal-organic decomposition, spin coating, sputtering, reactive sputtering, metal-organic chemical vapor deposition, physical vapor deposition, plasma-assisted chemical vapor deposition, pulsed laser deposition, chemical vapor deposition evaporation and like deposition techniques. A high temperature anneal may need to be performed at this time to obtain desired ferroelectric properties.

After forming the structure shown in FIG. 1(b), which may include patterning of all the capacitor layers in one step or a plurality of steps, various wiring levels may be formed on top of the structure. This step of the present invention including the optional patterning step is illustrated by FIG. 1(c). When patterning is performed the patterned capacitor, i.e. layers 20, 22, 24 26 and optional 28 may be encapsulated by an optional dielectric layer (not shown) to protect the ferroelectric from out-diffusion of oxygen species and in-diffusion of hydrogen species. The optional dielectric encapsulant layer would typically be an oxide, nitride or oxynitride, such as $SiO_2$, $SiN_x$, $SiO_xN_y$, $TiO_2$, $Ta_2O_5$, or $Al_2O_3$.

The wiring levels are formed by first forming dielectric material 30 on the structure and thereafter forming conductive layers 32 therein using BEOL processing techniques that preferably operate well below the decomposition temperature of the oxygen source layer, for example, at or below 400° C. Dielectric layer 30 may be composed of the same or different dielectric material as layer 18; likewise conducting layers 32 may be composed of the same or different materials as conducting layers 16.

The at least partial decomposition of the oxygen source layer may occur concurrently with other steps in processing such as ferroelectric/high-epsilon material deposition, top electrode deposition, optional encapsulant deposition, and BEOL processing. The at least partial decomposition of the oxygen source layer may also take place during device operation (at a very slow rate) or during a post-BEOL anneal specifically directed toward releasing the desired amount of oxygen from the oxygen source layer into the ferroelectric capacitor to improve the storage characteristics of the same. The post-BEOL anneal may be conducted in a substantially inert gas atmosphere, e.g. vacuum, He, Ar and $N_2$, that can be optionally mixed with an oxidizing gas such as $O_2$, steam, $O_3$, $N_2O$ or $H_2O_2$. Preferred annealing temperatures that can be employed in the present invention are from about 350° to about 700° C., with from about 350° to about 500° C. being more highly preferred. Typically, annealing is carried out for a time period of from about 1 minute to about 4 hours, with from about 1 minute to about 10 minutes being more highly preferred. The annealing step may be carried out using a single ramp cycle or multiple ramp and soak cycles can also be used.

While the present invention has been particularly shown and described with respect to preferred embodiments thereof, it will be understood by those skilled in the art that the foregoing and other changes in form and detail may be made without departing from the spirit and scope of the present invention.

Having thus described our invention, what we claim as new and desire to secure by the Letters Patent is:

1. A method of fabricating an integrated ferroelectric/CMOS structure comprising the steps of:
   (a) forming at least one complementary metal oxide semiconductor (CMOS) device on a semiconductor wafer;
   (b) forming a ferroelectric capacitor over said CMOS device, said ferroelectric, capacitor comprising at least a ferroelectric layer and an oxygen source layer in proximity to a conductive electrode layer, wherein said oxygen source layer is a metal oxide having the formula $MO_x$, where M is a noble metal, a non-noble metal or mixtures and alloys thereof and x is from about 0.03 to about 3, and is capable of at least partially decomposing at temperatures below 700° C.;
   (c) forming wiring levels on said ferroelectric capacitor at temperatures below 450° C.; and
   (d) annealing the at least said wiring levels, said ferroelectric capacitor, and said at least one complementary metal oxide semiconductor(CMOS) device on said semiconductor wafer, at a temperature between 300° C. and 700° C. to at least partially decompose the oxygen source layer to release oxygen into the ferroelectric capacitor.

2. The method of claim 1 wherein said conductive electrodes are patterned or non-patterned.

3. The method of claim 1 wherein said oxygen source layer is patterned or non-patterned.

4. The method of claim 1 wherein said annealing step is carried out in an inert gas atmosphere that may optionally be mixed with an oxidizing gas.

5. The method of claim 1 wherein said ferroelectric capacitor is planar or non-planar.

6. The method of claim 1 wherein said ferroelectric layer of said ferroelectric capacitor is replaced with a high-epsilon layer having a dielectric constant of 20 or greater.

7. The method of claim 1 wherein said CMOS device includes a transistor region and a semiconductor substrate.

8. The method of claim 1 wherein said ferroelectric material is a perovskite-type oxide, a compound containing a pyrochlore structure, a potassium dihydrogen phosphate, phosphates of rubidium, cesium or arsenic and mixtures or multilayers thereof.

9. The method of claim 1 wherein said annealing step is carried out at a temperature of from about 350° to about 700° C. for a time period of from about 1 minute to about 4 hours.

10. The method of claim 1 where said ferroelectric capacitor further comprises a conductive counterelectrode layer.

11. The method of claim 7 wherein said semiconductor substrate is a semiconducting material selected from the group consisting of Si, Ge, SiGe, GaAs, InAs, InP, other III/V compounds and organic semiconductors.

12. The method of claim 8 wherein said perovskite-type oxide has the formula $ABO_3$ wherein B is at least one acidic oxide containing a metal from Group IVB, VB, VIB, VIIB, IIIA or IB of the Periodic Table of Elements, and A is an additional cation having a positive formal charge of from about 1 to about 3.

13. The method of claim 9 wherein said annealing step is carried out at a temperature of from about 350° to about 500° C. for a time period of from about 1 minute to about 10 minutes.

14. The method of claim 10 wherein said conductive electrode layer and said conductive counterelectrode layer are composed of the same or different conductive material selected from the group consisting of noble metals, noble metal oxides, conductive oxides and mixtures and multilayers thereof.

15. The method of claim 12 wherein said perovskite-type oxide is a titanate-based ferroelectric, a manganate-based material, a cuprate-based material, a tungsten-bronze niobate, tantalate or titanate, or a bismuth layered-tantalate, niobate or titanate.

16. The method of claim 15 wherein said perovskite-type oxide is strontium bismuth tantalate, strontium bismuth niobate, bismuth titanate, strontium bismuth tantalate niobate, lead zirconate titanate, lead lanthanum zirconate and compositions thereof modified by a dopant material.

17. A method of fabricating an integrated ferroelectric/CMOS structure comprising the steps of:

(a) forming at least one complementary metal oxide semiconductor (CMOS) device on a semiconductor wafer;

(b) forming a ferroelectric capacitor over said CMOS device, said ferroelectric capacitor comprising at least a ferroelectric layer and an oxygen source layer in proximity to a conductive electrode layer, wherein said oxygen source layer is a metal oxide having the formula $MO_x$, where M is a noble metal, a non-noble metal or mixtures and alloys thereof and x is from about 0.03 to about 3, and is capable of at least partially decomposing at temperatures below 700° C.; and (c) forming wiring levels on said ferroelectric capacitor at temperatures below 450° C., wherein said partially decomposing occurs during ferroelectric deposition, top electrode deposition, optional encapsulant deposition, BEOL process or device operation so as to release oxygen into the ferroelectric capacitor.

* * * * *